United States Patent
Zusman

(10) Patent No.: US 7,141,985 B2
(45) Date of Patent: Nov. 28, 2006

(54) FIELD PROGRAMMABLE DRIVER/TRANSMITTER FOR A PROXIMITY PROBE

(75) Inventor: George Zusman, Houston, TX (US)

(73) Assignee: Vicont, Inc., Houston, TX (US)

( * ) Notice: Subject to any disclaimer, the term of this patent is extended or adjusted under 35 U.S.C. 154(b) by 0 days.

(21) Appl. No.: 11/331,811

(22) Filed: Jan. 13, 2006

(65) Prior Publication Data
US 2006/0208744 A1    Sep. 21, 2006

Related U.S. Application Data

(60) Provisional application No. 60/662,969, filed on Mar. 18, 2005.

(51) Int. Cl.
*G01R 27/02* (2006.01)
(52) U.S. Cl. .................. 324/607; 324/635; 324/207.11
(58) Field of Classification Search ................ 324/607, 324/691, 699, 635, 207.11
See application file for complete search history.

(56) References Cited

U.S. PATENT DOCUMENTS

| 4,033,042 A | * | 7/1977 | Bently ........................ 33/661 |
| 5,854,553 A | * | 12/1998 | Barclay et al. ........ 324/207.16 |
| 6,661,222 B1 | * | 12/2003 | Twerdochlib .......... 324/207.26 |
| 6,741,074 B1 | * | 5/2004 | DeBlock et al. ............ 324/227 |
| 6,798,194 B1 | * | 9/2004 | Slates ................... 324/207.11 |
| 6,826,490 B1 | * | 11/2004 | Hala et al. .................... 702/41 |

* cited by examiner

*Primary Examiner*—Walter Benson
(74) *Attorney, Agent, or Firm*—Clarence E. Eriksen

(57) ABSTRACT

An electronics package for use with a proximity probe is disclosed that is capable of being calibrated to work with any proximity probe and cable and that is capable of being programmed in the field. The electronic package establishes and measures a plurality of gaps between the proximity probe and a target. An amplifier is operatively coupled to the proximity probe and produces an output which is digitized, linearized and stored. A linear piecewise approximation technique is used to approximate the voltage at the output of the amplifier for gaps that were not measured.

3 Claims, 7 Drawing Sheets

FIELD PROGRAMMABLE DRIVER/TRANSMITTER FOR A PROXIMITY PROBE

CROSS-REFERENCE TO RELATED APPLICATION

This application claims the benefit of the filing date of U.S. Provisional Application 60/662,969, filed Mar. 18, 2005.

BACKGROUND OF THE INVENTION

1. Field of the Invention

The present invention relates to a driver/transmitter for a proximity probe. More particularly, the present invention relates to such a driver which is field programmable.

2. Description of the Prior Art

Rotating machinery such as motors, generators, and turbines find widespread application in areas such as manufacturing, power generation, materials processing, as well as many others. Over time, such machinery is subject to wear and potential failure. Given the high operating revolutions per minute and high power dissipation of many industrial applications of such machinery, failure during operation may have severe consequences in terms of damage to the failed equipment itself as well as neighboring equipment and areas of the installation. In addition, preventive machinery shut downs for maintenance and repair can be very costly in terms of facility downtime and direct expense in labor and replacement parts. Accordingly, it has become important in this area to provide monitoring equipment associated with such rotating machinery to provide indications of its condition.

Some condition monitoring systems utilize eddy current proximity probes. Eddy current probes are well known for their ability to detect the position or condition of varying types of conductive materials. These probes are useful in a variety of related applications including position measurement, such as axial and radial runout or displacement of a rotating assembly. As illustrated in FIG. 1, a proximity probe system has been used to detect the lateral position 15 of a rotating shaft 10 in relation to its journal bearing 11 by mounting one or more probes 12 within the bearing in close proximity to the shaft. The probe is coupled by cable 13 to electronics unit 14.

Eddy current probes comprise an inductor, or coil, situated at the probe tip which is driven with a radio frequency (RF) signal which in turn creates a varying electromagnetic field in any adjacent conductive target material. This electromagnetic field produces eddy currents in the material that induce a counter-electromotive force (emf) in the eddy probe inductor, thereby altering the effective impedance of the inductor. The impedance of the probe therefore provides an indication of the distance between the target and the probe.

Conventionally, the RF oscillator which drives the eddy current probe circuit is an analog transistor-based oscillator such as the Colpitts oscillator. A Colpitts oscillator utilizes a transistor in conjunction with an LC tank circuit wherein the eddy current probe coil functions as the inductive element of the tank circuit A portion of the current flowing in the tank circuit is fed back to the base of the oscillator transistor. The distance between the conductive target area and the probe is often referred to as the "gap," and varying the gap varies the impedance of the detector coil and thereby varies the output frequency and voltage of the oscillator.

In order to function properly, the electronics unit 14 must be calibrated with the characteristics of the probe 12 and cable 13. Since there are several proximity probes manufacturers, and since the characteristics of the various probes and cables vary from manufacture to manufacturer, the utilization of one manufacturer's probe and cable with another manufacture's electronics package is not feasible because inaccurate data will be obtained. Further, even a given manufacturer may provide several different packages where each such package comprises a probe, cable and electronics unit. The proximity probe and cable from one such package cannot be utilized with the electronics unit from another package without obtaining inaccurate data. Nonetheless, probes, cables and electronics unit are routinely misapplied in the field.

Moreover, even a probe, cable and electronics package that has been factory calibrated to work with one type of target material may not produce accurate results in the field for the same type target material. This is due to differences in material characteristics between the target material in the factory and the target material in the field.

U.S. Pat. No. 5,854,553 discloses a so-called phase lock system, which should work in the application of FIG. 1, but only if the system has a narrow hold-in frequency range. Narrow hold-in frequency range means that system could be adjusted at the factory to work with particular cable length, material and probe type. But a system with narrow hold-in frequency range would not work with different cables, probes and materials. A system as in U.S. Pat. No. 5,854,553 with wide hold-in frequency range could not be applied because theoretically and practically it has the self-oscillation of the output signal and has no chance to be used for the application.

U.S. Pat. No. 6,664,782 (and others which this author has) is based on the premise of storing all possible material characteristics in a memory and using probe impedance measurements and a mathematical algorithm to automatically adjust the system to the correct gap measurements. This system could work with materials whose characteristics are downloaded in advance in a memory. Also, the system may work only with the cables and probe types provided by the company which manufactures the whole system and could not be field-calibrated with different probe or cable type made by other manufacturers. Additionally, as mentioned above, the characteristics of real materials in the field might be different from factory targets and this difference creates additional errors in a field for the above system.

Those skilled in the art would find it advantageous to have an electronics package that is capable of being calibrated to work with any proximity probe and cable and that is capable of being programmed in the field. These novel and useful results have been achieved by the driver/transmitter of the present invention.

SUMMARY OF THE INVENTION

In accordance with the present invention an electronics package for use with a proximity probe is provided that may be calibrated to work with any proximity probe and cable and which may be calibrated in the field. The electronics package comprises a linear motor for establishing and measuring a plurality of gaps between the proximity probe and a target. This plurality of gaps ranges between and includes the situation where there is no gap between the probe and the target and the situation there being a maximum gap between the probe and the target. An electronics package in accordance with the present invention further comprises amplifier circuitry operatively coupled to the proximity probe for producing an output voltage which is: (i) equal to zero volts when there is no gap between the probe and the target; (ii) equal to a predetermined voltage when there is a maximum gap between the probe and the target; and (iii) between zero volts and said predetermined voltage for the remainder of the plurality of gaps. An analog-to-digital converter is also provided which having an input and a plurality of outputs. The input to the analog-to-digital converter is connected to the output of the amplifier circuitry and the outputs of the analog-to-digital converter comprises a plurality of digital signals representing the digitized output voltage of the amplifier circuitry. A microprocessor is provided which receives the plurality of digital signals from the output of analog-to-digital converter and which calculates a coefficient to linearize the output voltage of the amplifier circuitry for each of said plurality of gaps. A memory device is also provided for storing the coefficient for each of said gaps at an address in the memory corresponding to the voltage at the output of the amplifier for that gap.

The microprocessor is programmed to use a linear piecewise approximation technique to estimate the voltage to be produced at the output of the amplifier circuitry for each gap that was not established by the linear motor, wherein the microprocessor calculates a coefficient to linearize said estimated voltage, and wherein the memory device stores the coefficient for each gap for which said voltage is estimated at an address in the memory corresponding to the estimated voltage.

DESCRIPTION OF SPECIFIC EMBODIMENTS

Figure 1:
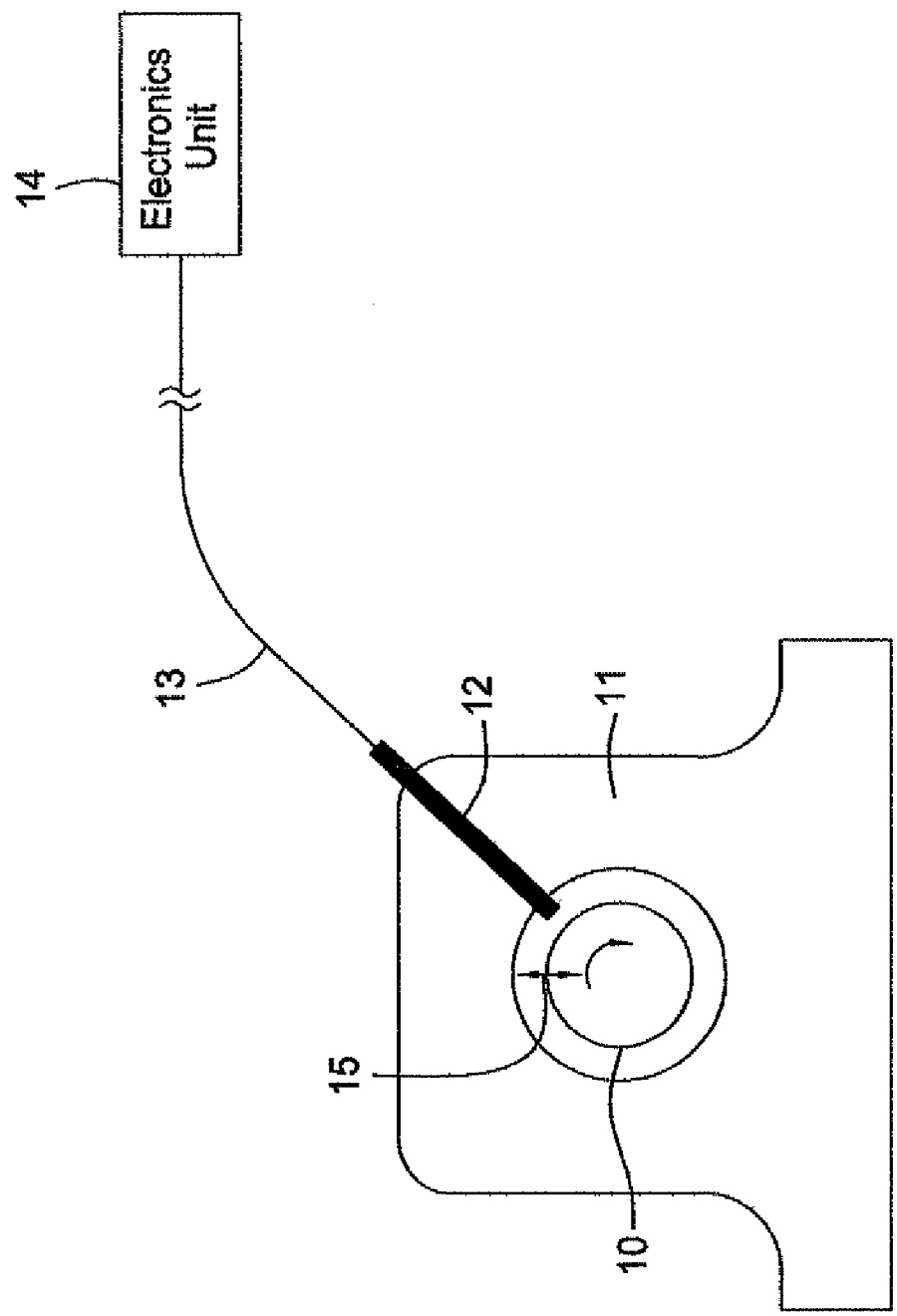
FIG. 1 is a pictorial drawing illustrating a conventional proximity probe system being used to monitor a rotating assembly.
Figure 2:
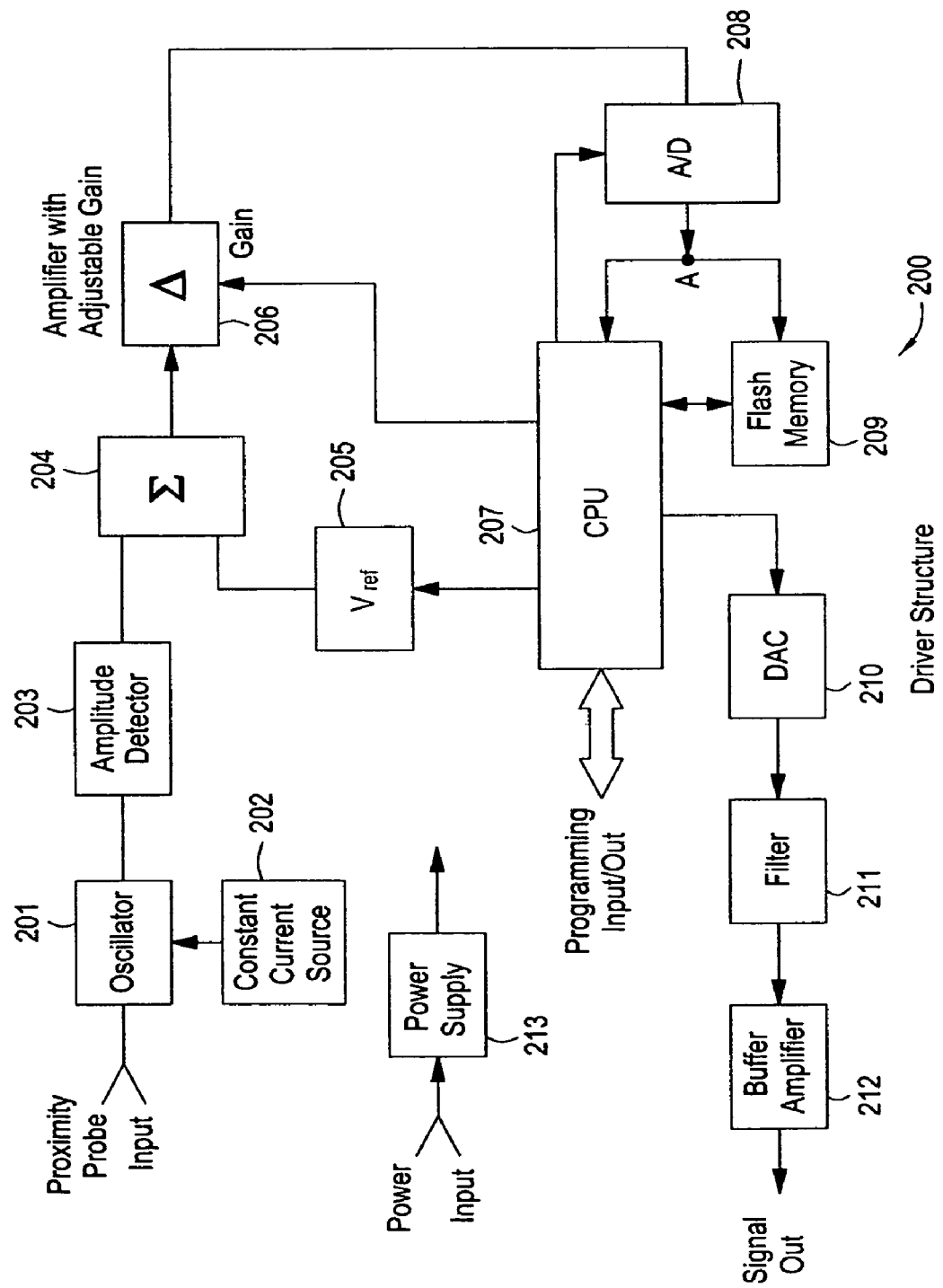
FIG. 2 is a schematic diagram is block diagram form illustrating one embodiment of a driver structure in accordance with the present invention.

With reference first to FIG. 2, one embodiment 200 of a driver in accordance with present invention is illustrated. Driver 200 comprises an oscillator 201 having an input coupled to one end of the cable attached to a proximity probe and another input coupled to constant current source 202. Constant current source 202 functions to ensure that oscillator 201 oscillates for all anticipated gaps, cable lengths and target materials. The output of oscillator 201 is connected to amplitude detector 203. The frequency of oscillation of oscillator 201 and the magnitude of the output voltage of oscillator 201 will vary depending upon the gap which is sensed by the proximity probe, as discussed below.

Amplitude detector 203 is coupled to one input of summation device 204, and the other input is of summation device 204 is coupled to the output of voltage source 205. Voltage source 205 may, for example, comprises digital resistors which are controlled by microprocessor or central processing unit ("CPU") 207 to produce a desired reference voltage, $V_{ref}$.

The output of summation device 204 is connected to amplifier 206 which is an amplifier with adjustable gain. The gain of amplifier 206 is controlled by CPU 207.

Analog-to-digital converter ("ADC") 208 receives the output of amplifier 206, and the outputs of ADC 208 are coupled to both CPU 207 and to the address inputs to flash memory 209. Outputs of CPU 207 are coupled to digital-to-analog ("DAC") converter 210, whose output drives filter 211. Filter 211 is preferably a low pass filter, which in one embodiment filters out signals having frequencies above 10 KHz. The output of filter 211 is coupled to buffer amplifier 212, which provides the output signal from driver structure 200 shown in FIG. 2. Power supply 213 provides power to the components illustrated in FIG. 2.

Figure 3:
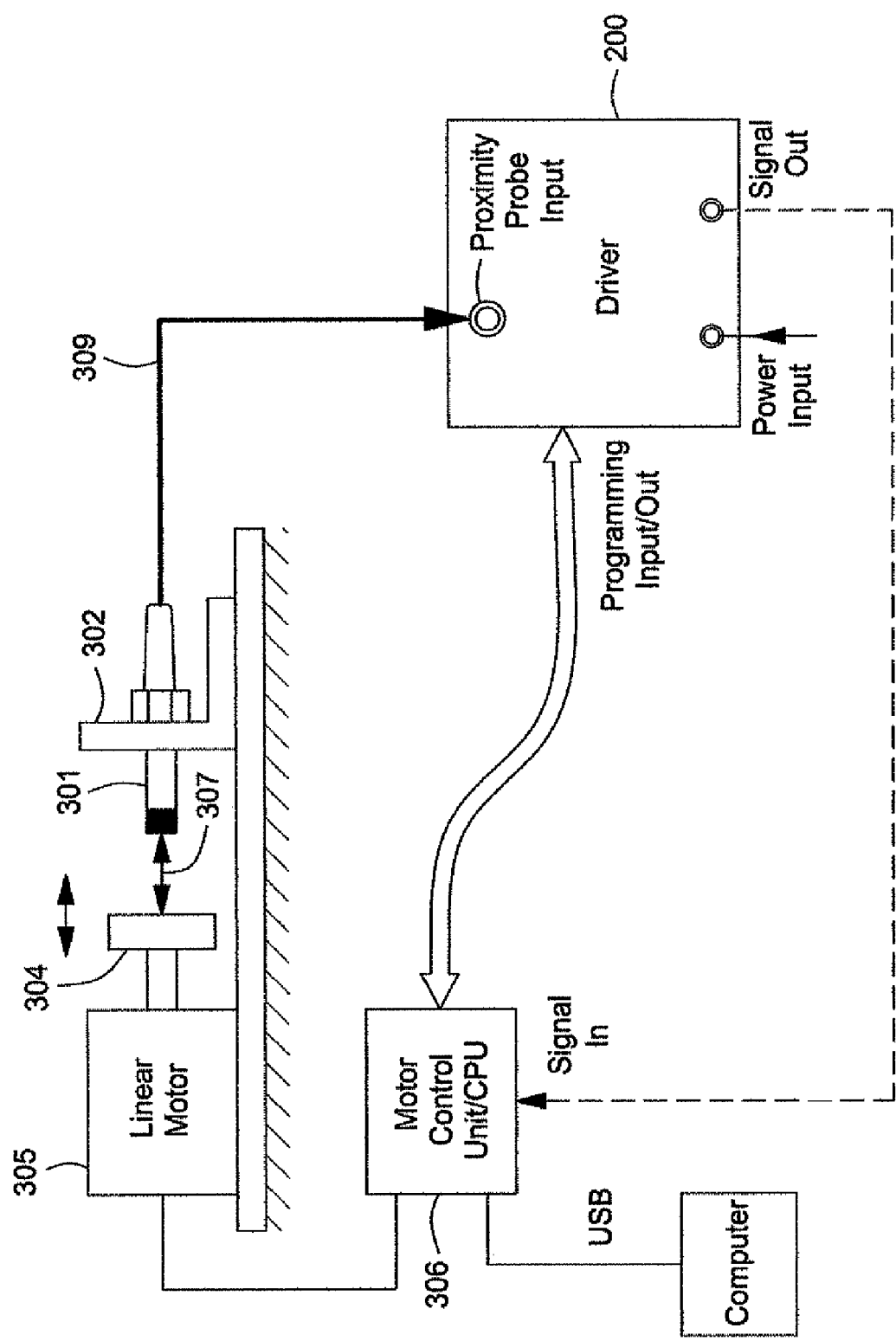
FIG. 3 is a block diagram illustrating apparatus for calibrating the driver of FIG. 2 in a factory.

With reference now to both FIGS. 2 and 3, the calibration of driver structure 200 is as follows: Proximity probe 301 is firmly secured in bracket 302. A cable 303 connects proximity probe 301 to driver structure 200. A target 304 is axially aligned with proximity probe 301 and linear motor 305 operates to move target 304 closer to or further away from proximity probe 301. A cable 309 couples linear probe 301 to driver structure 200. The movement of linear motor 305 is controlled by motor control unit 306 which may, for example, be a central processing unit.

Calibration of probe 301 begins with the gap 307 between probe 301 and target 304 being 0 mils. The output of summation device 204 (FIG. 2) is set to 0 volts by adjusting the value of the voltage source 205. Next, the gap 307 between target 304 and probe 301 is set to 120 mils and the output of adjustable gain amplifier 206 is adjusted until it is 5 volts. Linear motor 305 provides data to CPU 207 respecting these two gaps.

Figure 4A:
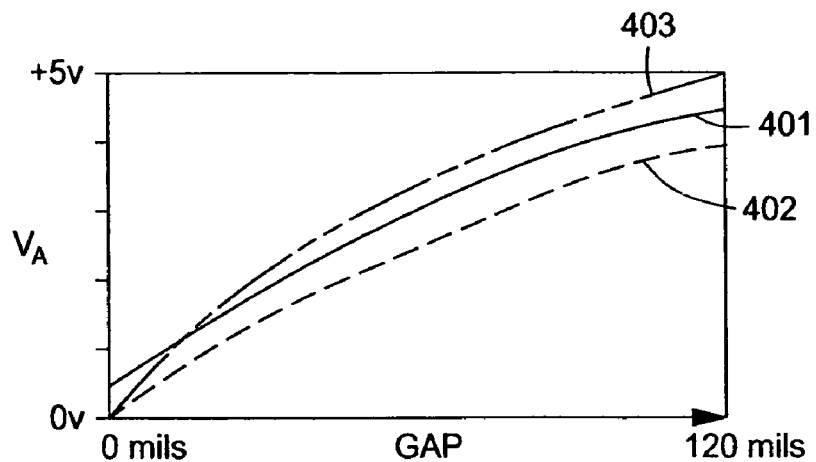
FIGS. 4A and 4B are graphs depicting voltages at node A in FIG. 2 during calibration.

With reference to FIGS. 2 and 4A, reference will sometimes be made herein for convenience to "the voltage at node A." It will be appreciated by those skilled in the art that "node A" in FIG. 2 represents the output of ADC 208 which in actuality comprises a plurality of digital signals representative of the analog voltage at the input of ADC 208.

In FIG. 4A, a graph is shown of the voltage at node A at the input to flash memory 209 during the foregoing initialization process. Graph 401 illustrates the voltage at node A in FIG. 2 before any adjustments are made. Graph 402 illustrates the voltage at node A after the output of summation device 204 has been adjusted to zero volts. Graph 403 indicates the voltage at node A after the output of adjustable gain amplifier 206 has been adjusted to +5 volts.

Figure 4B:
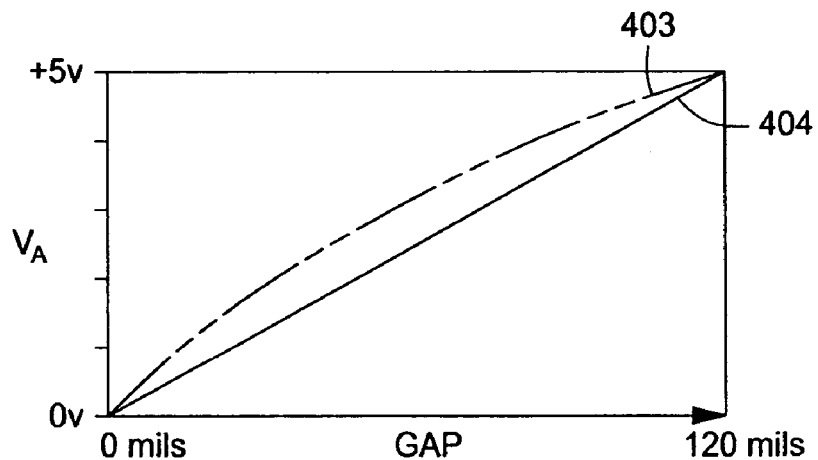

With reference to FIG. 4B, the graph 403 is not a straight line, i.e. it is not linear, while graph 404 is linear between the origin of the graph and the upper right hand corner of the graph. During the calibration process, the gap 307 between probe 301 and target 304 is adjusted a plurality of times between 0 mils and 120 mils. The number of such adjustments may, for example, total 100. For each of the 100 different gaps between 0 and 120 mils the output of ADC 208 will be a plurality of digital signals corresponding to the value of the voltage at its input, and those digital values will correspond to a voltage lying on line 403. Voltage $V_A$ at node A will lie along line 403 for each measured gap, and the CPU 207 calculates a coefficient such that the value of $V_A$ is adjusted to lie along graph 404. That adjusted value for $V_A$ is stored in flash memory 209 at an address determined by the digital signals at the output of ADC 208.

Figure 4C:
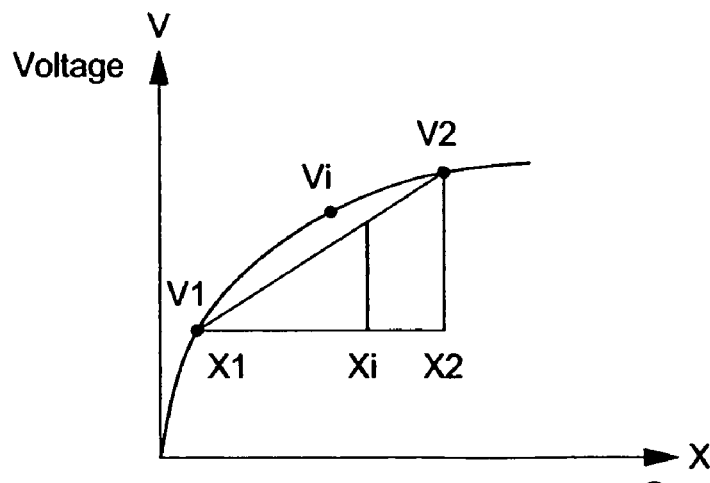
FIG. 4C is a graph illustrating the linearization technique used by apparatus in accordance with the present invention.

Since ADC 208 is preferably a 12-bit device, 4095 sets of possible outputs exist for ADC 208. The voltage corresponding to gaps which were not measured are estimated using a linear piecewise approximation technique illustrated in FIG. 4C. $V_1$ and $V_2$ in FIG. 4C are voltages corresponding to sequential measured gaps $X_1$ and $X_2$, respectively. According to the aforesaid technique, the value for the gap $X_i$ corresponding to Voltage $V_i$ is given by the formula $$X_i = X_1 + (X_2 - X_1) * (V_i - V_1)/(V_2 - V_1).$$

CPU 207 as defined above uses that formula to calculate $V_i$ and $V_i$ is adjusted. The adjusted value stored of $V_i$ in Flash Memory 209.

Figure 5:
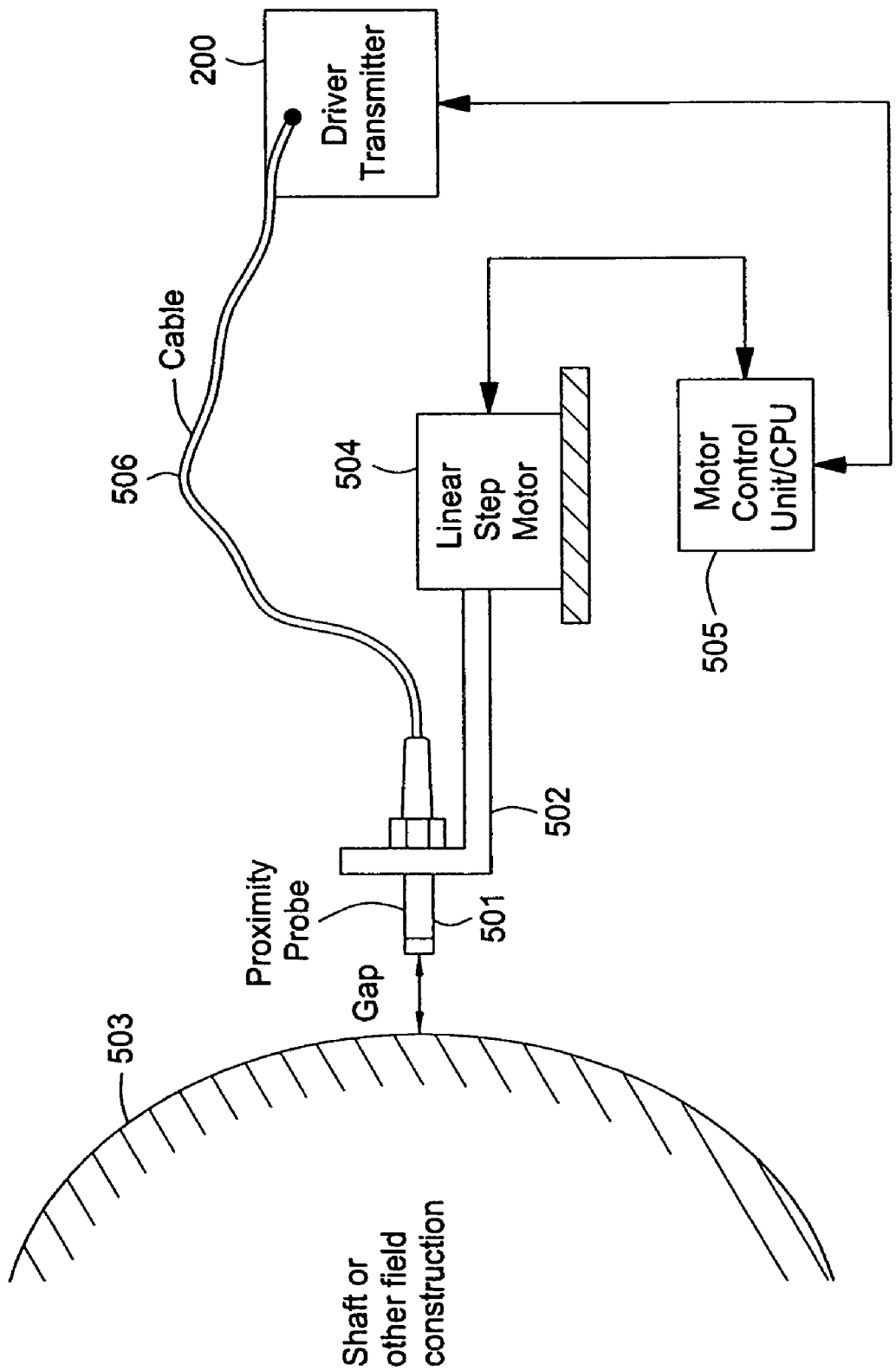
FIG. 5 is a block diagram illustrating apparatus for calibrating the driver of the present invention in the field.

With reference to FIG. 5, there is illustrated apparatus for calibration of the driver/transmitter 200 and proximity probe 501 when in the field. In FIG. 5, proximity probe 501 is securely mounted in bracket 502 to monitor the operation of shaft 503. The calibration of the proximity probe 501 and cable 506 begins by linear step motor 504, which is under the control of motor control unit/CPU 505, moving the proximity probe 501 such that there is a 0 mil gap between it and shaft 503. Linear step motor 504 then moves proximity probe 501 such that a 120 mil gap exists between the probe and the shaft 503. Linearization and calibration of driver/transmitter 200 is then effected as described above.

Figure 6:
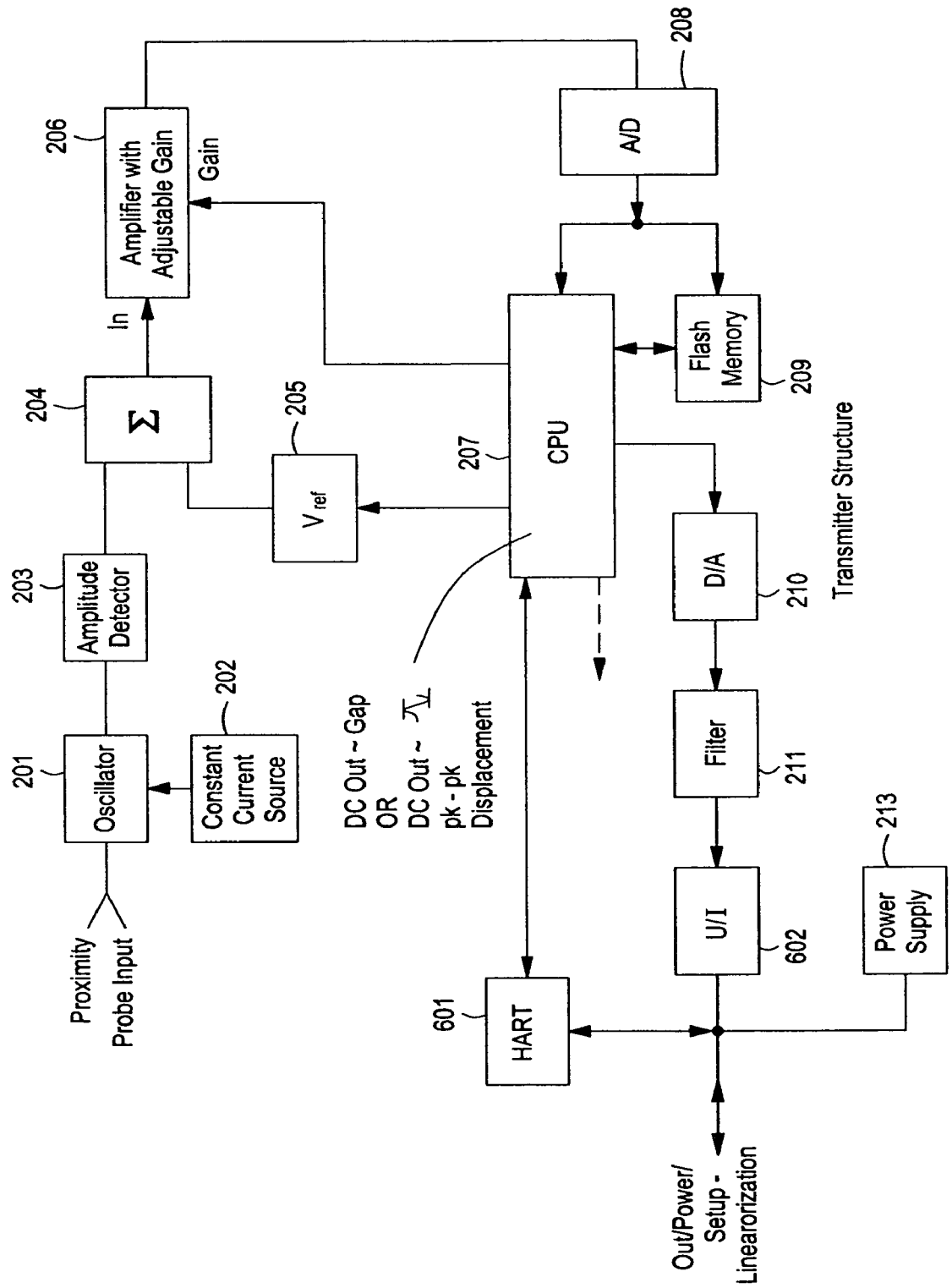
FIG. 6 is a schematic diagram in block diagram form of a driver in accordance with the present invention being adapted for use as a 4–20 ma transmitter.
Figure 7:
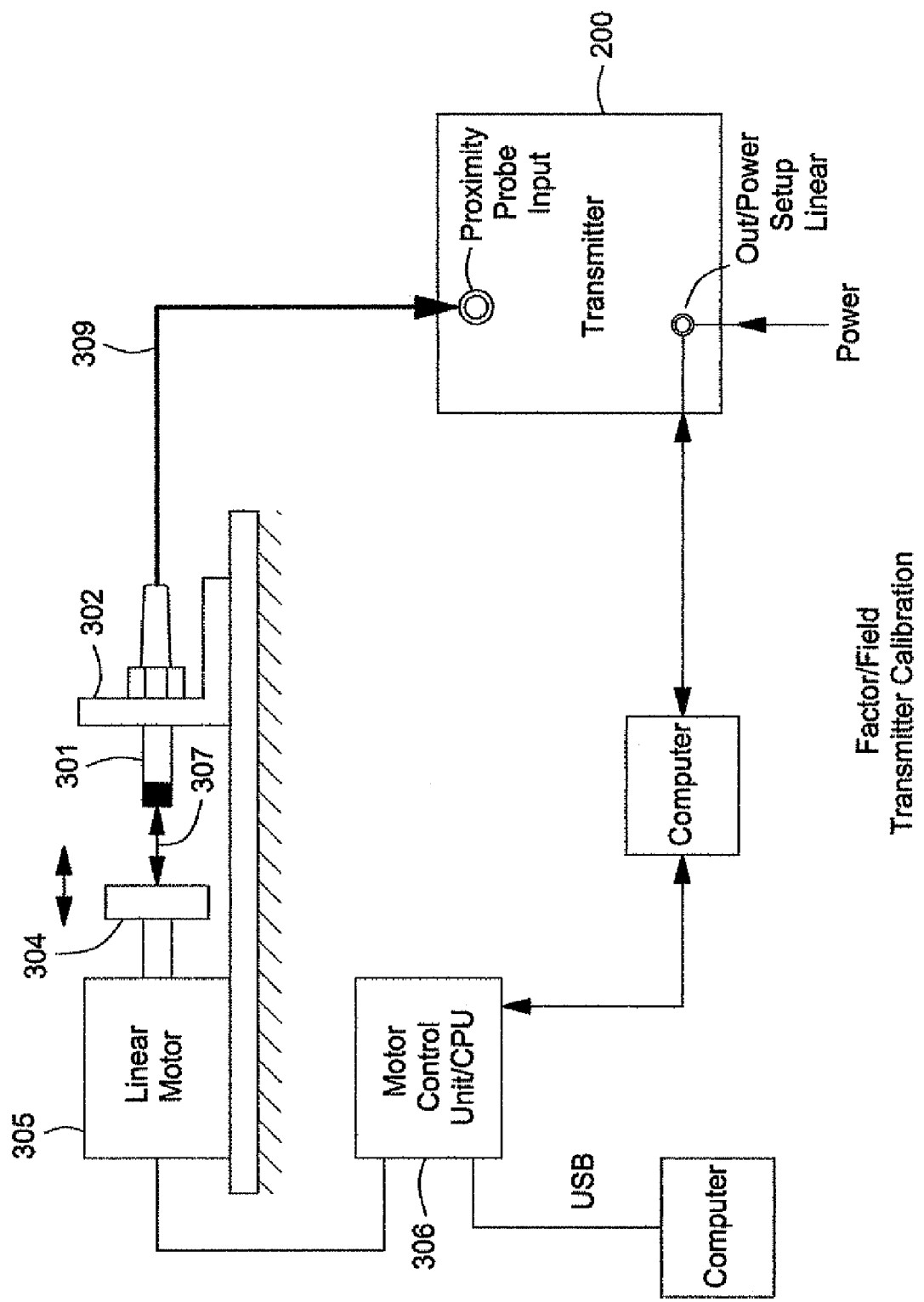
FIG. 7 is a block diagram illustrating apparatus for calibrating a 4–20 ma transmitter in a factory.

With reference now to FIG. 6, apparatus in accordance with the present invention may be used to provide a current output based on the gap between the proximity detector and the target. In one embodiment the output current is 4 ma for a zero mil gap. That output current increases linearly as the gap increases, reaching an output current of 20 ma at a gap of 120 mils.

The apparatus of FIG. 6 is similar to the apparatus of FIG. 2 with identically numbered elements in FIGS. 2 and 6 being the same type device. The apparatus of FIG. 6 differs from the apparatus of FIG. 2 by the addition of voltage to current converter 602 being coupled to the output of filter 211 and HART protocol generator 601.

A field programmable proximity unit in accordance with the present invention has a number of advantages over the prior art, such as:

Any probes having diameters between 5 and 8 mm could be used, including probes from different probe manufacturers.

Any cable length from 0.5 m to 10 m could be used with an existing probe.

Fast field mounted connector technology may be used in connection with proximity probes.

Different target materials could be used with the same proximity unit.

There would be one type of proximity unit for the particular customer or even for the particular industry (reduction of inventory).

The cost per unit and cost of maintenance will be reduced.

Field calibration (by using USB calibrator and computer).
Field tested (by using USB calibrator and computer).

What is claimed is:

1. An electronics package for use with a proximity probe, comprising:
    a) a linear motor for establishing and measuring a plurality of gaps between the proximity probe and a target, said plurality of gaps ranging between and including there being no gap between the probe and the target and there being a maximum gap between the probe and the target;
    b) amplifier circuitry which is operatively connected to the output of the proximity probe for producing an output voltage which is: (i) equal to zero volts when there is no gap between the proximity probe and the target; (ii) equal to a predetermined voltage when there is a maximum gap between the proximity probe and the target; and (iii) between zero volts and said predetermined voltage for the remainder of the plurality of gaps;
    c) an analog-to-digital converter having an input and a plurality of outputs, the input to said analog-to-digital converter being connected to the output of the amplifier circuitry and the outputs comprising a plurality of digital signals representing the digitized output voltage of the amplifier circuitry;
    d) a microprocessor which receives the plurality of digital signals from the output of analog-to-digital converter and which calculates a coefficient to linearize the output voltage of the amplifier circuitry for each of said plurality of gaps; and
    e) a memory device for storing the coefficient for each of said gaps at an address in the memory corresponding to the voltage at the output of the amplifier for that gap.

2. The apparatus of claim 1, wherein the microprocessor is programmed to use a linear piecewise approximation technique to estimate the voltage to be produced at the output of the amplifier circuitry for each gap that was not established by the linear motor, wherein the microprocessor calculates a coefficient to linearize said estimated voltage, and wherein the memory device stores the coefficient for each gap for which said voltage is estimated at an address in the memory corresponding to the estimated voltage.

3. The apparatus of claim 1, wherein the amplifier circuitry comprises: an oscillator having an input coupled to one end of the cable attached to a proximity probe and another input coupled to constant current source; an amplitude detector connected to the output of the oscillator; a summation device which has one input coupled to the amplitude detector; a microprocessor controlled voltage source, which is coupled to a second input of the summation device; and a microprocessor controlled gain amplifier having an input which is coupled to the output of the summation device.

* * * * *